United States Patent [19]

Koch et al.

[11] Patent Number: 4,777,115
[45] Date of Patent: Oct. 11, 1988

[54] PHOTOPOLYMERIZABLE COMPOSITION CONTAINING AN ETHYLENE TERPOLYMER

[75] Inventors: Horst Koch, Grosskarlbach; Walter Ziegler, Edingen-Neckarhausen, both of Fed. Rep. of Germany

[73] Assignee: BASF Aktiengesellschaft, Ludwigshafen, Fed. Rep. of Germany

[21] Appl. No.: 932,355

[22] Filed: Nov. 19, 1986

[30] Foreign Application Priority Data

Nov. 19, 1985 [DE] Fed. Rep. of Germany ....... 3540950

[51] Int. Cl.$^4$ ................................................ G03C 1/68
[52] U.S. Cl. ..................... 430/281; 430/288; 430/300; 430/907; 430/910
[58] Field of Search ............... 430/907, 910, 281, 300, 430/288

[56] References Cited

U.S. PATENT DOCUMENTS 4,010,128  3/1977  Saggese et al. .

FOREIGN PATENT DOCUMENTS 0115190  8/1984  European Pat. Off. .
2359626  11/1973 Fed. Rep. of Germany .
2718047  11/1977 Fed. Rep. of Germany .
1298732  12/1972 United Kingdom .
1386794  3/1975  United Kingdom .
1514497  6/1978  United Kingdom .

Primary Examiner—Jack P. Brammer
Attorney, Agent, or Firm—Keil & Weinkauf

[57] ABSTRACT

Mixtures crosslinkable by photopolymerization and based on binders, photopolymerizable monomers compatible therewith and photoinitiators, contain as binders copolymers prepared from ($a_1$) from 30 to 70% by weight of ethylene, ($a_2$) from 5 to 40% by weight of (meth)acrylic acid and ($a_3$) from 5 to 50% by weight of one or more vinyl ester, vinyl ether, (meth)acrylic acid ester and/or (meth)acrylamide.

9 Claims, No Drawings

PHOTOPOLYMERIZABLE COMPOSITION CONTAINING AN ETHYLENE TERPOLYMER

The present invention relates to mixtures which are crosslinkable by photopolymerization and based on binders, photopolymerizable monomers compatible therewith and photoinitiators which contain as binders copolymers based on ethylene, (meth)acrylic acid and one or more further comonomers, and which are suitable for preparing photocrosslinkable printing plates, relief plates and photoresists and also photocrosslinked printing forms, relief forms and photoresists. The present invention also relates to photocrosslinked printing plates, relief plates and photoresists and printing forms, relief forms and photoresists having improved properties which have been prepared with the novel mixtures.

Mixtures of this kind are common knowledge and have been frequently described. However, many of them have disadvantages, such as, for example, insufficient flexibility, elasticity, storability or chemical stability, an excessive ozone sensitivity, thermolability or swellability in printing ink solvents or insufficient solubility or dispersibility in liquid polar media. This frequently complicates or prevents use thereof in the preparation of photocrosslinked letterpress or planographic printing forms, relief forms or photoresists.

Mixtures which contain ethylene copolymers are likewise known.

For instance, U.S. Pat. No. 4,010,128 describes flexographic printing forms which for example comprise ethylene/ethyl acrylate copolymers and styrene-1,3-butadiene-styrene block copolymers. But these are not photocrosslinkable mixtures; the printing letterpress must be incorporated into these layers by impressing a conventional printing form matrix.

German Laid-Open Application DOS No. 2,548,451 describes a process for preparing letterpress printing forms made of fiber material, wherein a surface film of, for example, ethylene/vinyl acetate, ethylene/acrylic acid or ethylene-acrylate copolymers is applied to a layer of synthetic fibers by impressing the printing pattern by means of a matrix. In this case too the mixtures are not photocrosslinkable.

These mixtures and the forms prepared therefrom are consequently of no help in solving the problems which arise in connection with the use of customary photocrosslinkable mixtures.

German Laid-Open Application DOS No. 2,718,047 describes a water-developable photocrosslinkable mixture which contains a water-soluble methacrylic acid polymer. This polymer can also contain ethylene, although only in an amount of up to 30%, preferably up to 15%, indicated as the ratio of the repeating units in the polymer chain, since otherwise the solubility in water is lost. These mixtures are used in particular for preparing offset printing forms. The photocrosslinked forms prepared from these photocrosslinkable mixtures are too hard and too brittle for other purposes.

Ethylene copolymers which, in addition to ethylene, also contain two or more other comonomers are likewise known and are used for a wide variety of purposes. For instance, British Patent No. 1,386,794 describes the use of an ethylene copolymer which has from 2 to 40% by weight of methacrylic acid and from 5 to 48% by weight of a vinyl ester, alkyl acrylate or alkyl methacrylate for preparing steel laminates.

German Laid-Open Application DOS No. 2,359,626 describes a copolymer latex for preparing adhesives, the copolymer essentially containing from 5 to 25% by weight of ethylene, from 0.1 to 10% by weight of (meth)acrylic acid, from 60 to 90% by weight of a vinyl ester and from 0.1 to 10% by weight of a hydroxyalkyl acrylate.

German Laid-Open Application DOS No. 2,136,076 recommends copolymers of from 50 to 93% by weight of ethylene, from 2 to 40% by weight of methacrylic acid and from 5 to 48% by weight of a mixture of a vinyl ester and an alkyl (meth)acrylate for bonding a silicate glass plate to a plastics plate. European Patent No. 115,190 describes ionomers comprising for example from 10 to 87% by weight of ethylene, from 3 to 30% by weight of acrylic acid and from 10 to 60% by weight of an alkyl acrylate or of a vinyl ether, whose carboxyl groups are from 3 to 90% neutralized, and the use thereof as coatings for golf balls. The use of such ethylene copolymers in mixtures crosslinkable by photopolymerization is not known.

It is an object of the present invention to provide novel mixtures crosslinkable by photopolymerization for preparing photocrosslinkable printing plates, relief plates and photoresists and photocrosslinked printing forms, relief forms and photoresists which, in the unexposed state, are readily soluble or dispersible in liquid polar media and have a high storability and, in the exposed state, have a high solubility differentiation between exposed and unexposed areas, a high flexibility, elasticity, chemical stability, thermostability, abrasion resistance and dimensionl stability, a low swellability in printing ink solvents and in particular a very low ozone sensitivity. It is a further object of the present invention to provide improved photocrosslinkable printing plates, relief plates and photoresists and improved photocrosslinked printing forms, relief forms and photoresists.

We have found that these objects are achieved with mixtures crosslinkable by photopolymerization and based on binders, photopolymerizable monomers compatible therewith and photoinitiators, which contain as binders copolymers prepared from (a₁) from 30 to 70, in particular from 40 to 60% by weight of ethylene, (a₂) from 5 to 40, in particular from 8 to 30% by weight of (meth)acrylic acid and (a₃) from 5 to 50, in particular from 20 to 40% by weight of one or more vinyl ester, vinyl ether, (meth)acrylic acid ester and/or (meth)acrylamide.

We have also found that these mixtures are highly suitable for preparing photocrosslinkable printing plates, relief plates and photoresists and photocrosslinked printing forms, relief forms and photoresists. We have further found photocrosslinkable printing plates, relief plates and photoresists and photocrosslinked printing forms, relief forms and photoresists of high elastomeric properties and ozone stability which were prepared using these mixtures.

Said plates, forms and photoresists are referred to hereinafter, for short, as "light-sensitive recording materials".

For the purposes of the present invention, the term liquid polar media refers to such solvents, solvent mixtures or mixtures of solvents and additives as have a high dipole moment and/or ionic charges and therefore are capable of entering dipole-dipole, dipole-ion or ion-ion interactions with themselves or with other compounds. The term liquid polar media also includes such solvents, solvent mixtures or mixtures of solvents and additives as have the aforementioned properties and additionally possess loosely bonded protons or hydroxyl ions.

In the light of the cited prior art, it was surprising and not foreseeable that the copolymers to be employed according to the invention can be used to prepare mixtures crosslinkable by photopolymerization which are elastomeric and, despite their high ethylene content, soluble or at least readily dispersible in liquid polar media and also stable to ozone and which for that reason are very highly suitable for preparing light-sensitive recording materials. These in turn have surprising advantages. For instance, in the unexposed state they are storable, dimensionally stable and nontacky. After imagewise exposure with actinic light, they exhibit excellent solubility differentiation between their exposed and unexposed areas, so that they are simple to develop by means of liquid polar, and in particular aqueous, media. The developed light-sensitive recording materials, furthermore, are so flexible that they can be repeatedly clamped onto small printing cylinders. In addition, they undergo little swelling, if any, in aqueous printing inks; they are dimensionally stable and abrasion-resistant and, moreover, stable to ozone. Even with long print runs, they thus permit very good image reproduction which is exact and faithful even in the finest details. The recording materials according to the invention additionally have other significant and important application advantages compared with the prior art, for example better shadow well depth in screened halftone areas and negative lines.

The binder copolymers of $a_1$ ethylene, $a_2$ (meth)acrylic acid and $a_3$ one or more vinyl ester, vinyl ether, (meth)acrylic acid ester and/or (meth)acrylamide are known per se. They are prepared by the LDPE (low density polyethylene) high-pressure polymerization method at 200°-400° C. under more than 800 kg/cm² [see for example German Patent No. 2,341,462, U.S. Pat. No. 3,264,272 and German Patent Application P No. 35 39 469.2 (O.Z. 38087)].

Vinyl esters suitable for use as comonomers $a_3$ are in particular those of the general structure (I)

where R is alkyl or cycloalkyl of 1 to 10 carbon atoms, for example vinyl acetate, vinyl propionate, vinyl butyrate, vinyl valerate or vinyl hexanoate, of which vinyl acetate is preferred.

Vinyl ethers suitable for use as comonomers $a_3$ are in particular those of the structure (II)

for example vinyl ethyl ether, vinyl 1-propyl ether, vinyl 1-butyl ether, vinyl 2-butyl ether or vinyl 1-pentyl ether, of which vinyl 1-butyl ether is preferred.

(Meth)acrylic acid esters and (meth)acrylamides suitable for use as comonomers $a_3$ are in particular those of the structure (III)

where $R^1$ is hydrogen or methyl, Z is oxygen or an $NR^3$ group (with $R^3$=H or $C_1$–$C_4$-alkyl) and $R^2$ is alkyl or cycloalkyl of 1 to 10 carbon atoms or ω-alkyl-poly(alkylene oxide)-α-oxyl. Suitable (meth)acrylic acid esters and amides are for example methyl acrylate, methyl methacrylate, ethyl acrylate, ethyl methacrylate, propyl acrylate, propyl methacrylate, n-butyl acrylate, n-butyl methacrylate, n-pentyl acrylate, n-pentyl methacrylate, n-hexyl acrylate, n-hexyl methacrylate, tert.-butyl acrylate, cyclohexyl acrylate, cyclohexyl methacrylate, 2ethylhexyl acrylate, 2-ethylhexyl methacrylate, dicyclopentadienyl acrylate, ω-methyl-poly(ethylene oxide)-α-yl (meth)acrylate, ω-methyl-poly(propylene 1,2-oxide)-α-yl (meth)acrylate, ω-methyl-poly(propylene 1,3-oxide)-α-yl (meth)acrylate, N-ethylacrylamide, N-methyl-N-butylmethacrylamide or N-ethyl-N-(2-ethylhexyl)-acrylamide. Preference is given to n-butyl acrylate, 2-ethylhexyl acrylate, ω-methyl-poly(ethylene oxide)-α-yl acrylate and dicyclopentadienyl acrylate, of which the first three are particularly preferred.

Preferred binders are accordingly ethylene/(meth)acrylic acid copolymers which contain n-butyl acrylate, 2-ethylhexyl acrylate and/or Ω-methyl-poly(ethylene oxide)-α-yl acrylate as copolymerized comonomers $a_3$ and have a Shore A hardness of greater than 10, in particular from 15 to 75. The copolymers to be employed according to the invention are used in an amount of from 30 to 99.5, advantageously from 40 to 96, preferably from 50 to 93, and in particular from 60 to 90% by weight, based on a mixture according to the invention.

Suitable photopolymerizable monomers are nongaseous and must be capable of forming a high polymer via a free radical initiated chain propagation reaction and addition polymerization and also be compatible with the binders according to the invention. Compatible is to be understood here as meaning the ability of two or more constituents to remain dispersed in one another.

A class of suitable photopolymerizable monomers comprises the unsaturated esters of alcohols, in particular esters of α-methylenecarboxylic acids and substituted α-methylenecarboxylic acids, in particular esters of this kind with alkylenepolyols and polyalkylenepolyols, of which alkylenepolyol di- and triacrylates and polyalkylenepolyol di- and triacrylates which have been prepared from alkylenepolyols of 2 to 15 carbon atoms or polyalkylene ether polyols or glycols having 1 to 10 ether bonds are particularly preferred.

The following specific compounds illustrate further suitable monomers: ethylene glycol diacrylate, diethylene glycol diacrylate, glycerol diacrylate, glycerol triacrylate, trimethylolpropane triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, 1,2-benzenedimethanol diacrylate, pentaerythritol triacrylate, pentaerythritol tetramethacrylate, 1,3-propanediol diacrylate, 1,3-pentanediol dimethacrylate, p-α,α-dimethylbenzylphenyl acrylate, tert.-butyl acrylate, N,N-diethylaminoethyl acrylate, N,N-diethylaminoethyl methacrylate, 1,4-butanediol diacrylate, 1,6-hexanediol diacrylate, 1,6-hexanediol dimethacrylate, 1,10-decanediol diacrylate, 2,2-dimethylolpropane diacrylate, tripropylene glycol diacrylate, 2,2-di(p-hydroxyphenyl)propane diacrylate, 2,2-di(p-hydroxyphenyl)propane dimethacrylate, polyoxyethyl-2,2-di(p-hydroxyphenyl)propane dimethacrylate, polyoxypropyltrimethylolpropane triacrylate (molecular weight 462), 1,4-butanediol dimethacrylate, 1,6-hexanediol methacrylate, 2,2,4-trimethyl-1,3-pentanediol dimethacrylate, 1-phenylethylene-1,2-diol dimethacrylate, trimethylolpropane di(meth)acrylate, triethylene glycol diacrylate, tetramethylene glycol diacrylate, ethylene glycol acrylate phthalate, polyoxyethyltrimethylolpropane triacrylate, diacrylate and dimethacrylate esters of diepoxypolyethers which have been derived from aromatic polyhydroxy compounds, for example bisphenols, novolaks and similar compounds, such as, for example, the compounds described in U.S. Pat. No. 3,661,576, and the bisacrylates and bismethacrylates of polyethylene glycols of molecular weight 200 to 500 and the like. However, it is also possible to use alkylpolyalkylene oxide mono(meth)acrylates, for example ω-methyl-poly(ethylene oxide)-α-yl acrylate. Also suitable are reaction products of glycerol, epichlorohydrin and acrylic acid in a molar ratio of, for example, 1:3:3.

A further class of suitable monomers is formed by the compounds described in U.S. Pat. No. 2,927,022, for example compounds having a plurality of olefinic bonds which are polymerizable by polyaddition, in particular if they are present as terminal bonds, in particular compounds in which at least one and preferably most of these bonds are conjugated with a double-bonded carbon, including carbon which is double-bonded to carbon and heteroatoms such as nitrogen, oxygen and sulfur. Preference is given to compounds in which the ethylenically unsaturated groups, in particular the vinylidene groups, are conjugated with ester or amide structures. Specific examples of such compounds are the unsaturated amides, in particular those with α-methylenecarboxylic acids, ω-diamines and ω-diamines which are interrupted by oxygen, for example methylenebisacrylamide, methylenebismethacrylamide, ethylenebismethacrylamide, 1,6-hexamethylenebisacrylamide, diethylenetriaminetrismethacrylamide, bis(γ-methacrylamidopropoxy)-ethane, β-methacrylamidoethyl methacrylate, N-(β-methacryloxyethyl)-acrylamide, vinyl esters, for example divinyl succinate, divinyl adipate, divinyl phthalate, divinyl terephthalate, divinyl benzene-1,3-disulfonate and divinyl butane 1,4-disulfonate and diallyl fumarate.

Further suitable monomers are: styrene and styrene derivatives, 1,4-diisopropenylbenzene, 1,3,5-triisopropenylbenzene, adducts of itaconic anhydride with hydroxyethyl acrylate (1:1), with liquid butadieneacrylonitrile polymers which contain terminal amino groups, and adducts of itaconic anhydride with diacrylates and dimethacrylates of diepoxypolyethers which are described in U.S. Pat. No. 3,661,576, polybutadiene and butadieneacrylonitrile copolymers with terminal and lateral vinyl groups and unsaturated aldehydes, for example sorbaldehyde (2,4-hexadienal).

Suitable monomers which are water-soluble or contain carboxyl groups or other groups capable of reaction with alkali are particularly highly suitable if the material is to be developable with aqueous media. It is also possible to use the polymerizable, olefinically unsaturated polymers and similar materials mentioned in U.S. Pat. Nos. 3,043,805 and 2,929,710 alone or as a mixture with other materials. Acrylic acid esters and methacrylic acid esters of adducts of ethylene oxide and polyhydroxy compounds as described in U.S. Pat. No. 3,380,831 are likewise suitable.

When carboxyl-containing monomers are used, the carboxyl groups can be wholly or partly neutralized with metal hydroxides, carbonates and the like or with inorganic and organic nitrogen bases such as ammonia or triethylamine.

In general, the suitable photopolymerizable monomers are used in an amount of from 1 to 40, in particular from 5 to 30% by weight, based on a mixture according to the invention.

Preference is given to trimethylolpropane triacrylate, 1,6-hexanediol diacrylate, 1,6-hexanediol dimethacrylate, ω-methyl-poly(ethylene oxide)-α-yl acrylate and tetraethylene glycol diacrylate.

Suitable photoinitiators which are to be used on their own or as a mixture with one another are for example acyloins and derivatives thereof, such as benzoin, benzoin alkyl ethers, for example benzoin isopropyl ether, α-methylolbenzoin and ethers thereof, for example α-methylolbenzoin methyl ether, or α-methylbenzoin and α-methylbenzoin ethyl ether; vicinal diketones and derivatives thereof, for example benzil, benzil acetals, such as benzil dimethyl acetal, benzil methyl ethyl acetal, benzil methyl benzyl acetal or benzil ethyleneglycol acetal; and also in particular acylphosphine oxide compounds of the type described for example in DE-A-No. 29 09 992 and DE-A-No. 31 14 341 for use in photopolymerizable mixtures. Preferred representatives of initiators from the class of the acylphosphine oxides are 2,6-dimethoxybenzoyldiphenylphosphine oxide, 2,4,6-trimethylbenzoyldiphenylphosphine oxide, ethyl 2,4,6-trimethylbenzoylphenylphosphinate and sodium 2,4,6-trimethylbenzoylphenylphosphinate. The photoinitiators can also be used in combination with other coinitiators and/or activators as described in the relevant literature. Also suitable, however, are photoreactive initiators which initiate a cationic polymerization, such as the pyrrylium hexafluoroarsenates described in European Patent No. 74,073. Preference is given to benzil dimethyl acetal and/or 2,4,6-trimethylbenzoyldiphenylphosphine oxide. oxide.

In general, suitable photoinitiators are used in an amount of from 0.001 to 10, preferably from 0.1 to 8 and in particular 0.1 to 3% by weight, based on a mixture according to the invention.

The mixtures according to the invention can further contain suitable nonphotopolymerizable or nonphotocrosslinkable aids and/or additives. These include, for example, inhibitors of thermally initiated polymerization, processing aids and plasticizers, dyes and pigments and also salifiers, i.e. cation-donating substances.

Suitable inhibitors of thermally initiated polymerization are for example hydroquinone, hydroquinone derivatives, 2,6-di-tert.-butyl-p-cresol, nitrophenols, N-nitrosamines, such as N-nitrosodiphenylamine or the salts, in particular the alkali metal, calcium and aluminum salts, of N-nitrosocyclohexylhydroxylamine. Preference is given to 2,6-di-tert.-butyl-p-cresol and the alkali metal salts of N-nitrosocyclohexylhydroxylamine. In general they are used in amounts of from 0.001 to 5% by weight, based on a mixture according to the invention.

Examples of suitable processing aids and plasticizers are dialkyl phthalates, alkyl phosphates, sulfonamides, poly-ethylene glycol, and polyethylene glycol esters and ethers. It is also possible to use amphiphiles based on polyethylene glycol/fatty acids or polyethylene glycol/polypropylene oxide block copolymers. In general they are used in an amount of from 1 to 20% by weight, based on a mixture according to the invention.

Suitable dyes are in particular the soluble phenazinium, phenoxazinium, acridinium and phenothiazinium dyes, e.g. neutral red (C.I. 50,040), safranine T (C.I. 50,240), rhodanil blue, the salt or amide of rhodamine D (Basic Violet 10, C.I. 45,170), methylene blue (C.I. 52,015), thionine (C.I. 52,025) and acridine orange (C.I. 46,005); or even Sudan deep black X 60 (C.I. 26,150). These dyes, which can in general be added in amounts of from 0.0001 to 2% by weight, based on a mixture according to the invention, are advantageously used together with a sufficient amount of a reducing agent which does not reduce the dye in the absence of actinic light, but which, on exposure to light, can reduce the dye in the excited state. Examples of such mild reducing agents are ascorbic acid, anethole, thiourea and derivatives thereof, such as diethylallylthiourea and in particular N-allylthiourea, and also hydroxylamine derivatives, preferably salts of N-nitrosocyclohexylhydroxylamine, in particular the potassium, calcium and aluminum salts. The latter can also be used as inhibitors to thermally initiated polymerization. The amount of added reducing agent cn in general be from about 0.005 to 5% by weight, in particular from 0.01 to 1% by weight, based on a mixture according to the invention, in many cases the addition of from 3 to 10 times the amount of the dye having proved advantageous.

Suitable salifiers are 1. inorganic metal compounds such as oxides, hydroxides, alkoxides where alkyl is of 1 to 4 carbon atoms or carbonates of the cations of Li, Mg, Ca, Sr, Ba, Al, Ga, In, Ge, Sn, Pb, Sb, Bi, Zn, Cd, Mg, Cn, Sc, Y, La, Ti, Zr, Hf, V, Nb, Ta, Cr, Mo, W, Mn, Re, Fe, Co, Ni, Pd or the lanthanides or 2. organic metal compounds of the structure (IV)

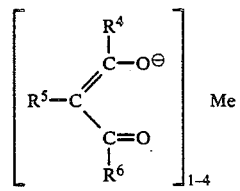

where Me is a cation of one of the aforementioned elements, $R^4$, $R^5$ and $R^6$ are each the same or a different kind of alkyl, cycloalkyl, aryl or alkylaryl, it being possible for $R^4$ and $R^6$ to be bonded to each other cyclically via ring systems, and where $R^5$ can also be hydrogen, 3. polyfunctional amines such as ethylenediamine, diethylenetriamine, N-methyl-N-ethylethylenediamine, N,N-dimethylethylenediamine, N,N'-diethylethylenediamine, N,N,N',N'-tetramethylethylenediamine, N,N,N'',N''-tetramethylethylenetriamine, 1,3-diaminopropane, 1,4-diaminobutane, pyrazine or polyvinylpyridine or 4. hydrazine.

Preference is given to the oxides, hydroxides, alkoxides, carbonates and acetylacetonates of $Li^+$, $Mg^{2+}$, $Ca^{2+}$, $Sr^{2+}$, $Ba^{2+}$, $Al^{3+}$, $Sn^{2+}$, $Sb^{3+}$ and $Zn^{2+}$, of which bis(acetylacetonato)-Zn(II), MgO and LiOH are particularly preferred.

They can be used in an amount of from 0.05 to 20, preferably from 0.5 to 15 and in particular from 1 to 10% by weight, based on a copolymer to be employed according to the invention.

Further aids and additives are agents for improving the relief structure, for example 9,9'-dianthronyl and 10,10'-bisanthrone as described in German Laid-Open Application DOS No. 2,720,560.

All these components of the mixtures crosslinkable by photopolymerization, or of the light-sensitive recording materials, have to be adapted to one another in such a way that, after imagewise exposure with actinic light, the light-sensitive recording materials can be washed out, i.e. are developable, with liquid polar media. Examples of liquid polar media which can be used are diethyl ether, di-n-butyl ether, ethyl butyl ether, tetrahydrofuran, dioxane, acetone, methyl ethyl ketone, methyl butyl ketone, acetonitrile, propionitrile, acetylacetone, ethyl acetylacetate, pyridine, pyrrole, pyrazine, chloroform, water, methanol, ethanol, propanol, n-butanol, ethanolamine, diethanolamine, triethanolamine, acetic acid or propionic acid and mixtures thereof, if miscible. They can also contain additives, for example ammonia, amines, metal hydroxides, organic and inorganic acids, organic and inorganic salts and also organic compounds. Preference is given to an 0.5% strength alkali metal hydroxide solution in water, water containing 0.5% by weight of alkali metal hydroxide and 0.01% by weight of sodium paraffinsulfonate of 12 to 18 carbons in the hydrocarbon chain, and a mixture of tetrachloroethylene and n-butanol in a volume ratio of 4:1.

The preparation, from the components mentioned, of the novel mixtures crosslinkable by photopolymerization has no special methodological features, but can be effected in a suitable manner by kneading, mixing and dissolving techniques.

To prepare light-sensitive recording materials, the mixtures according to the invention can then be shaped into sheetlike structures of varying thickness in a suitable manner, for example by casting from solution, hot pressing, calendering or extruding. These sheetlike structures are used as light-sensitive recording materials either as such or bonded to other sheetlike materials. In what follows, the sheetlike structures are referred to as relief-forming layer (RL). Recording materials which have a relief-forming layer (RL) combined with other sheetlike materials are referred to hereinafter as multilayer elements.

The thickness of the relief-forming layer (RL) can vary within wide limits, depending on the use intended for the light-sensitive recording materials, and will in general be within the range from 0.1 to 6000 μm. Preferred thicknesses for preparing letterpress forms, relief forms and photoresists are within the range 20 to 6500 μm and for preparing planographic printing forms within the range from 1 to 200 μm.

Suitable bases (B) in such multilayer elements are the dimensionally stable, rigid or flexible bases customary and known for preparing printing forms, relief forms or photoresist patterns. They include in particular dimensionally stable plastics films, for example polyester films, elastomeric films or foams and also metallic bases, for example steel, iron, nickel or aluminum sheets or conical nickel sleeves. To prepare photoresist layers, it is also possible to use copper, copper-coated materials, printed circuits etc. as base materials for the relief-forming layers (RL). The bases (B), in particular those made of metal, can be pretreated in a conventional manner mechanically, chemically, electrochemically and/or by priming. To obtain sufficient adhesion between base (B) and relief-forming layer (RL), one or more, generally from 0.4 to 40 μm thick, adhesive layers can be arranged between the base (B) and the relief-forming layer (RL), in particular in the case of multilayer elements for the preparation of printing and relief forms. The choice of base material depends chiefly on the proposed use of the multilayer elements. The adhesive layer between base (B) and relief-forming layer (RL) can be made for example of known polyurethane-based one- or two-component adhesives or adhesive layers as described in German Laid-Open Application DOS No. 3,015,419.

The relief-forming layer (RL) of the multilayer elements can additionally be covered with one or more bright or matt cover sheet and/or protective cover sheet which, for example, comprises polyvinyl alcohol having a high degree of hydrolysis or mixtures of polyvinyl alcohol with the copolymers to be employed according to the invention. Also possible, however, are protective and/or cover films made of polystyrene, polyethylene, polypropylene or polyethylene terephthalate which can be peeled off the relief-forming layer (RL) after or before imagewise exposure with actinic light. A protective and/or cover sheet and a corresponding peel-off film can be used together, the cover sheet and/or protective cover sheet being directly in contact with the relief-forming layer (RL) and staying firmly bonded thereto as the film is peeled off. Between the cover sheet and/or protective cover sheet and the corresponding film there may additionally be present an antiadhesive coating as described in European Patent No. 68,599. The cover and/or protective cover sheets and films and also the base (B) can contain antihalation agents.

The light-sensitive recording materials and multilayer elements are suitable for example for preparing planographic printing forms or photoresists as used for example in the manufacture of printed circuits, integrated circuits, in semiconductor technology, in etching etc. and also for preparing relief structures. They are particularly suitable, however, for preparing flexographic and letterpress printing forms, including in the case of the latter jobbing forms. To this end, the relief-forming layer (RL) of the light-sensitive recording materials or the multilayer elements is exposed imagewise in a conventional manner with actinic light and developed with liquid polar media by washing out the unexposed, uncrosslinked areas of the layer.

Exposure, which can take the form of flat-plate or rotary exposure, can be effected with the conventional sources of actinic light, for example UV fluorescence tubes, mercury high-, medium- or low-pressure lamps, superactinic luminescent tubes, xenon pulsed lamps, metal halide-doped lamps, carbon arc lamps etc. The emitted wavelength should in general be from 230 to 450 nm, preferably from 300 to 420 nm, and be adapted to the self-absorption of the photoinitiator used.

The relief image can be developed by washing, brushing etc. with the polar developer solvent. Owing to the high water stability of the exposed relief-forming layer (RL), the recording materials and multilayer elements have the advantage that the washout conditions during development can be intensified without impairing the printing forms, relief forms or photoresist patterns. On the contrary, crisper relief structures are obtained as a result. After the washout, the resulting printing forms, relief forms or photoresist patterns are dried in a conventional manner, if dsired at temperatures up to 120° C. . In some cases it is expedient subsequently to subject the printing forms, relief forms or photoresist patterns obtained once more to uniform exposure with actinic light to increase the strength of the relief layer.

These light-sensitive recording materials, which are prepared using the mixtures according to the invention, result not only in printing forms, relief forms and photoresist patterns having an extremely high water stability, so that they have a long shelf life and high degree of reusability even in a moist warm atmosphere, but also in products of better shadow depths and better crispness than the conventional systems, of pronounced relief structure, high elasticity and smooth surface.

The invention is explained by the Examples below. The parts and percentages in the Examples are by weight, unless otherwise stated. Parts by volume relate to parts by weight as the liter relates to the kilogram.

The Examples according to the invention involved a number of copolymers prepared as described in German Patent No. 2,341,462, U.S. Pat. No. 3,264,272 or German patent application P No. 35 39 469.2 (O.Z. 38087). Their composition is shown in Table 1 and important application properties in Table 2.

The Shore A hardness was determined in accordance with DIN 53,505. The melt flow index (MFI) was measured at 160° C. under a force of 325 p or at 190° C. under a force of 2.16 kp. The ozone stability of the recording materials was determined at 25° C. at an ozone concentration of 50 ppm on 10 cm long samples which had been subjected to an elongation of 10%; the criterion was whether cracks appeared within 10 hours. The swelling in % by weight was determined after 24 hours of submersion in water at 25° C.

TABLE 1

| Copolymer/ | Composition of the copolymers | | | | |
|---|---|---|---|---|---|
| | Content of copolymerized monomers (%) | | | | |
| monomers | 1 | 2 | 3 | 4 | 5 |
| Ethylene | 53.8 | 43.9 | 57.1 | 51.6 | 52 |
| Acrylic acid | 9.2 | 19.2 | 18.9 | 14.4 | 17 |
| n-Butyl acrylate | 37 | 37 | 24 | — | 19 |
| ω-Methyl-poly-(ethylene oxide)-α-yl acrylate | — | — | — | 24 | 12 |
| 2-Ethylhexyl acrylate | — | — | — | 10 | — |

TABLE 2

| Copolymer/ | Properties of the copolymers | | | | |
|---|---|---|---|---|---|
| property | 1 | 2 | 3 | 4 | 5 |
| MFI* | 200[2] | 15[1] | 48[2] | 28[1] | 15[1] |
| Shore A hardness | 21 | 14 | 40 | 35 | 22 |

*MFI = melt flow index;
[1]160° C./325 p;
[2]190° C./2.16 kp;

Preparation of mixtures crosslinkable by photopolymerization and of light-sensitive recording materials and multilayer elements

EXAMPLE 1

A mixture was prepared from the following components:
76.494% of copolymer 2 as per Table 1,
10% of trimethylolpropane triacrylate,
10% of tetraethylene glycol diacrylate,
3% of benzil dimethyl acetal
0.5% of 2,6-di-tert.-butyl-p-cresol and
0.006% of Sudan Deep Black X 60 (C.I. 26,150).

The components were dissolved in a solvent mixture of toluene and methyl ethyl ketone in a volume ratio of 1:1, and the end concentration of the solution was adjusted with the solvent mixture to 28%, based on the total weight of the solution. The solution was cast onto a 125 μm thick polyethylene terephthalate film so that a dry thickness of 1000 μm resulted. After laminating with a 9 μm thick polyester film, this multilayer element was exposed for 25 minutes through a negative original. The 9 μm thick polyester film was then removed, and the exposed layer was developed for 20 minutes in 0.5% strength aqueous sodium hydroxide solution with a brush washer. Drying gave a relief image having a relief depth of 700 μm and corresponding to the transparent areas of the negative. The swelling after 24 hours of submersion in water at 20° C. was only 0.6% by weight. The resilient and flexible plate had a nontacky surface and excellent image resolution. Even after prolonged storage there were no ozone cracks in the surface. The resilient and flexible plate was capable of repeated clamping to a small printing cylinder without problems and gave very good printing results even after repeated use.

EXAMPLE 2

A mixture and a multilayer element were prepared as in Example 1 from
86.5% of copolymer 3 as per Table 1, 6.3% of 1.6-hexanediol diacrylate,
3.7% of 1,6-hexanediol dimethacrylate,
3% of benzil dimethyl acetyl and
0.5% of 2,6-di-tert.-butyl-p-cresol.
The multilayer element was exposed for 20 minutes through a negative original and developed for 30 minutes at 40° C. in 0.5% strength aqueous potassium hydroxide solution with a brush washer. Drying gave a plate having a Shore A hardness of 63 and a relief depth of 700 μm and also excellent application properties.

EXAMPLE 3

A mixture was prepared from:
85% of copolymer 4 as per Table 1,
10% of trimethylolpropane triacrylate,
3% of benzil dimethyl acetal and
2% of 2,6-di-tert.-butyl-p-cresol
by kneading for 20 minutes at 120° C. in a plastograph, by first plasticizing the binder and then adding a mixture of monomer, initiator and inhibitor. The result obtained was a transparent, tacky mass, which was hot-pressed at 120° C. between a steel base and a polyester film to a thickness of 1250 μm. After cooling down, this multilayer element was exposed imagewise for 10 minutes and, after removal of the polyester film, developed with a brush washer in 0.5% strength aqueous sodium hydroxide solution which contained 0.01% of sodium paraffinsulfonate. Drying left a relief layer having a relief depth of 800 μm and a hardness of 61 Shore A.

EXAMPLE 4

A mixture was prepared in a twin-screw extruder by extruding
82.994% of copolymer 5 as per Table 1, stabilized with 2,6-di-tert.-butyl-p-cresol,
10% of ω-methyl-poly(ethylene oxide)-α-yl acrylate,
5.0% of trimethylolpropane triacrylate,
2.0% of benzil dimethyl acetal and
0.006% of Sudan Deep Black X 60 (C.I. 26,150)

In detail, copolymer 5 was introduced into the extruder at a uniform rate by way of a screw conveyor, and melted at 140° C. . The other components were pumped into the extruder in succession, and the mixture was discharged through a broad-slot die. A calender roll was used to prepare a 3000 μm thick relief-forming layer between a 125 μm thick polyester film and a 3 μm thick polyvinyl alcohol substrate. This multilayer element was preexposed for 3 minutes through the polyester film and then fully exposed for 20 minutes through a negative original placed on top of the polyvinyl alcohol substrate. After removal of the negative original, the recording material was divided and developed (a) with 0.5% strength aqueous sodium hydroxide solution at 50° C. in a brush washer and (b) with tetrachloroethylene/n-butanol (volume ratio 4:1) in a spray washer. Both developments gave plates having a relief depth of 1000 μm and a Shore A hardness of from 48 to 50. The swelling in water was less than 5% by weight. Both the plates were ozone-resistant and capable of repeated clamping onto small printing cylinders without breaking.

EXAMPLE 5

A mixture was prepared as described in Example 1 from
88% of copolymer 1 as per Table 1,
6.7% of 1,6-hexanediol diacrylate,
3.3% of 1,6-hexanediol dimethacrylate and
2% of benzil dimethyl acetal.
The solution was cast onto a 300 μm thick steel sheet so that a dry thickness of 1600 μm resulted. After laminating with a 9 μm thick polyester film this multilayer element was exposed for 15 minutes through a negative original. The film was then removed, and the element was developed for 6 minutes with a mixture of tetrachloroethylene/n-butanol (volume ratio 4:1). Drying gave a plate having good image resolution, a relief depth of 600 μm and a Shore A hardness of 44.

We claim:
1. A photopolymerizable mixture comprising
(A) from 40 to 96% by weight, based on the mixture, of one or more copolymer binders consisting of
   (a$_1$) from 30 to 70% by weight of ethylene,
   (a$_2$) from 5 to 40% by weight of acrylic acid or methacylic acid, and
   (a$_3$) from 5 to 50% by weight of one or more comonomers selected from the group consisting of vinyl esters of the strucutre (I),

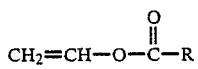

where R is alkyl or cycloalkyl or 1 to 10 carbon atoms, vinyl ethers, acrylic acid esters, methacrylic acid esters, acrylamides and methacrylamides,
(B) from 1 to 40% by weight, based on the mixture, of one or more nongaseous, photopolymerizable, ethylenically unsaturated monomers which are compatible with said binders (A), and
(C) from 0.001 to 10% by weight, based on the mixture, of one or more photoinitiators.

2. The photopolymerizable mixture of claim 1 further comprising (D) from 0.001 to 5% by weight, based on the mixture, of one or more inhibitors of thermally initiated polymerization,
(E) from 1 to 20% by weight, based on the mixture, of processing aids and plasticizers,
(F) from 0.0001 to 2% by weight, based on the mixture, of a dye.

3. The photopolymerizable mixture of claim 2 further comprising
(G) from 0.005 to 5% by weight, based on the mixture, of a reducing agent.

4. The photopolymerizable mixture of claim 1 wherein the copolymer binders (A) consist of
($a_1$) from 40 to 60% by weight of ethylene,
($a_2$) from 8 to 30% by weight of acrylic acid or methacrylic acid, and
($a_3$) from 20 to 40% by weight of one or more comonomers selected from the group consisting of vinyl esters of the strucuture (I)

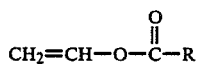

where R is alkyl or cycloalkyl of 1 to 10 carbon atoms, vinyl ethers, acrylic acid esters, methacrylic acid esters, acrylamides and methacrylamide.

5. The photopolymerizable mixture of claim 1 wherein the nongaseous, photopolymerizable, ethylenically unsaturated monomers (B) are selected from the group consisting of trimethylolpropane triacylate, 1,6-hexanediol diacrylate, 1,6-hexanediol dimethacrylate, ω-methyl-poly(ethylene oxide)-α-yl acrylate and tetraethylene glycol diacrylate.

6. The photopolymerizable mixture of claim 1 wherein the comonomers ($a_3$) are acrylic acid esters selected from the group consisting on n-butyl acrylate, 2-ethylhexyl acrylate and ω-methyl-poly(ethylene oxide)-α-yl acrylate.

7. The photopolymerizable mixture of claim 5 wherein the comonomers ($a_3$) are acrylic acid esters selected from the group consisting of n-butyl acrylate, 2-ethylhexyl acrylate and ω-methyl-poly(ethylene oxide)-α-yl acrylate.

8. The photopolymerizable mixture of claim 1 wherein the photopolymerizable, ethylenically unsaturated monomers (B) are selected from the group consisting of trimethylolpropane triacrylate, 1,6-hexanediol diacrylate, 1,6-hexanediol dimethacrylate, ω-methyl-poly(ethylene oxide)α-yl acrylate and tetraethylene glycol diacrylate.

9. The photopolymerizable mixture of claim 3 wherein the comonomer ($a_3$) are acrylic acid esters selected from the group consisting of n-butyl acrylate, 2-ethylhexyl acrylate and ω-methyl-poly(ethylene oxide)-α-yl acrylate.

* * * * *

UNITED STATES PATENT AND TRADEMARK OFFICE
CERTIFICATE OF CORRECTION

PATENT NO. : 4,777,115
DATED : October 11, 1988
INVENTOR(S) : Koch et al.

It is certified that error appears in the above-identified patent and that said Letters Patent is hereby corrected as shown below:

Column 12, Line 51

(strucutre)...

Structure ...

Column 12, line 52

.... or cycloalkyl (or) ...

.... or cycloalkyl of ...

Signed and Sealed this

Second Day of May, 1989

*Attest:*

DONALD J. QUIGG

*Attesting Officer*     *Commissioner of Patents and Trademarks*